US011327121B2

(12) United States Patent
Pressman et al.

(10) Patent No.: US 11,327,121 B2
(45) Date of Patent: May 10, 2022

(54) DEVIATION DETECTION SYSTEM FOR ENERGY STORAGE SYSTEM

(71) Applicant: GE Global Sourcing LLC, Norwalk, CT (US)

(72) Inventors: Jacob Pressman, Lawrence Park, PA (US); Ajith Kuttannair Kumar, Erie, PA (US)

(73) Assignee: Transportation IP Holdings, LLC, Norwalk, CT (US)

( * ) Notice: Subject to any disclaimer, the term of this patent is extended or adjusted under 35 U.S.C. 154(b) by 37 days.

(21) Appl. No.: 16/374,447

(22) Filed: Apr. 3, 2019

(65) Prior Publication Data

US 2020/0319259 A1 Oct. 8, 2020

(51) Int. Cl.
| G05B 19/042 | (2006.01) |
| G01R 31/396 | (2019.01) |
| G01R 31/36 | (2020.01) |

(52) U.S. Cl.
CPC ....... *G01R 31/396* (2019.01); *G01R 31/3648* (2013.01); *G05B 19/042* (2013.01); *G05B 2219/2639* (2013.01)

(58) Field of Classification Search
None
See application file for complete search history.

(56) References Cited

U.S. PATENT DOCUMENTS

| 8,219,333 | B2* | 7/2012 | Li | B60L 58/18 |
| | | | | 702/63 |
| 8,994,339 | B1* | 3/2015 | Kam | H02J 7/0029 |
| | | | | 320/150 |
| 2001/0001533 | A1* | 5/2001 | Stuck Andersen | ........................ |
| | | | | H02J 7/007194 |
| | | | | 320/150 |
| 2005/0182536 | A1* | 8/2005 | Doyle | G01R 31/3647 |
| | | | | 701/31.4 |
| 2007/0008666 | A1* | 1/2007 | Morita | B60L 3/0023 |
| | | | | 361/42 |
| 2009/0130538 | A1* | 5/2009 | Kaita | B60L 58/18 |
| | | | | 429/50 |
| 2011/0148361 | A1* | 6/2011 | Yokotani | B60L 58/21 |
| | | | | 320/136 |
| 2011/0313613 | A1* | 12/2011 | Kawahara | B60L 58/14 |
| | | | | 701/34.4 |

(Continued)

*Primary Examiner* — Jason Lin
(74) *Attorney, Agent, or Firm* — The Small Patent Law Group LLC; Philip S. Hof

(57) ABSTRACT

A system includes a first group of sensors and a control circuit including one or more processors. The first group of sensors is associated with an energy storage module having one or more energy storage devices. The sensors in the first group generate sensor measurements representing one or more parameters of the energy storage module. The control circuit is configured to receive the sensor measurements and determine one or more of a reference value or a reference variation of a specific parameter related to the energy storage module based at least in part on the sensor measurements. The control circuit compares one or more of monitored values or monitored variations of the specific parameter, based on the sensor measurements generated by sensors, to the reference value or the reference variation of the specific parameter and detects a deviation that is greater than a designated tolerance margin.

20 Claims, 5 Drawing Sheets

(56) References Cited

U.S. PATENT DOCUMENTS

| | | | |
|---|---|---|---|
| 2015/0104680 A1* | 4/2015 | Wang | B60L 58/26 |
| | | | 429/50 |
| 2017/0018817 A1* | 1/2017 | Simmonds | H01M 10/425 |
| 2017/0040646 A1* | 2/2017 | Beaston | H02J 7/0026 |
| 2018/0149701 A1* | 5/2018 | Koo | G01R 19/16542 |
| 2019/0033380 A1* | 1/2019 | Kim | G01R 31/3865 |
| 2019/0072616 A1* | 3/2019 | Matsushita | G01R 31/371 |
| 2020/0091562 A1* | 3/2020 | Mi | G01R 31/396 |

* cited by examiner

DEVIATION DETECTION SYSTEM FOR ENERGY STORAGE SYSTEM

FIELD

The inventive subject matter described herein relates to a deviation detection system for use with an energy storage system.

BACKGROUND

Energy storage systems may utilize a large number of battery cells can be difficult to manage and monitor. A failure in one battery cell or module of plural cells can be undesirable and cause secondary damage in other cells within the same or different modules. Known systems for monitoring energy storage systems compare sensor measurements to preset, absolute limits or thresholds, and trigger an action/alarm condition if one or more of the sensor measurements exceed a corresponding preset limit, such as a preset temperature threshold. But, the known systems may be relatively inaccurate and/or slow to detect potential failures because a failure is not able to be detected until a preset limit is crossed. Furthermore, the known systems may provide little if any additional information that could be used for reducing damage, such as the location of the failure (e.g., which specific cells of the thousands are affected) for providing service or isolating the affected section of the storage system, the type of failure (e.g., fire, bad weld, sensor malfunction, etc.), and the like. It may be desirable to have a method and/or system for the early detection of failures and additional information about the failures for protecting the energy storage system and reducing secondary damage.

BRIEF DESCRIPTION

In one or more embodiments, a system is provided that includes a first group of sensors and a control circuit including one or more processors. The first group of sensors is associated with an energy storage module that includes one or more energy storage devices. The sensors in the first group are configured to generate sensor measurements representing one or more parameters of the energy storage module. The control circuit is configured to receive the sensor measurements generated by the sensors and determine one or more of a reference value or a reference variation of a specific parameter related to the energy storage module based at least in part on the sensor measurements. The control circuit is configured to compare one or more of monitored values or monitored variations of the specific parameter, based on the sensor measurements generated by sensors of the first group, to the reference value or the reference variation of the specific parameter and detect a deviation that is greater than a designated tolerance margin.

In one or more embodiments, a method is provided that includes obtaining sensor measurements generated by a first group of sensors associated with an energy storage module. The energy storage module includes one or more energy storage devices. The sensor measurements represent one or more parameters of the energy storage module. The method includes comparing one or more of monitored values or monitored variations of a specific parameter related to the energy storage module to one or more of a reference value or a reference variation of the specific parameter. Both the one or more of the monitored values or monitored variations and the one or more of the reference value or the reference variation are based at least in part on the sensor measurements generated by the first group of sensors. The method includes detecting a deviation condition responsive to one or more of the monitored values or monitored variations deviating from the reference value or the reference variation by more than a designated tolerance margin. The method also includes identifying a first sensor of the first group that generated sensor measurements on which one or more of the deviating monitored values or monitored variations are based, and estimating a cause of the deviation condition based at least in part on the sensor measurements generated by the first sensor.

In one or more embodiments, a system is provided that includes a control circuit with one or more processors. The control circuit is configured to obtain sensor measurements generated by a first group of sensors associated with an energy storage module that includes one or more energy storage devices. The sensor measurements represent one or more parameters of the energy storage module. The control circuit is configured to compare the sensor measurements that represent a specific parameter of the one or more parameters to one or more of a reference value of the specific parameter or a reference variation of the specific parameter. In response to detecting that one or more of the sensor measurements deviates from the reference value or the reference variation by more than a designated tolerance margin, the control circuit is configured to identify a first sensor of the first group that generated at least some of the one or more deviating sensor measurements, estimate a cause of the deviation based at least in part on the sensor measurements generated by the first sensor, and generate a control signal to initiate one or more remedial actions based on the estimated cause.

BRIEF DESCRIPTION OF THE DRAWINGS

Reference is now made briefly to the accompanying drawings, in which.

DETAILED DESCRIPTION

Figure 1:
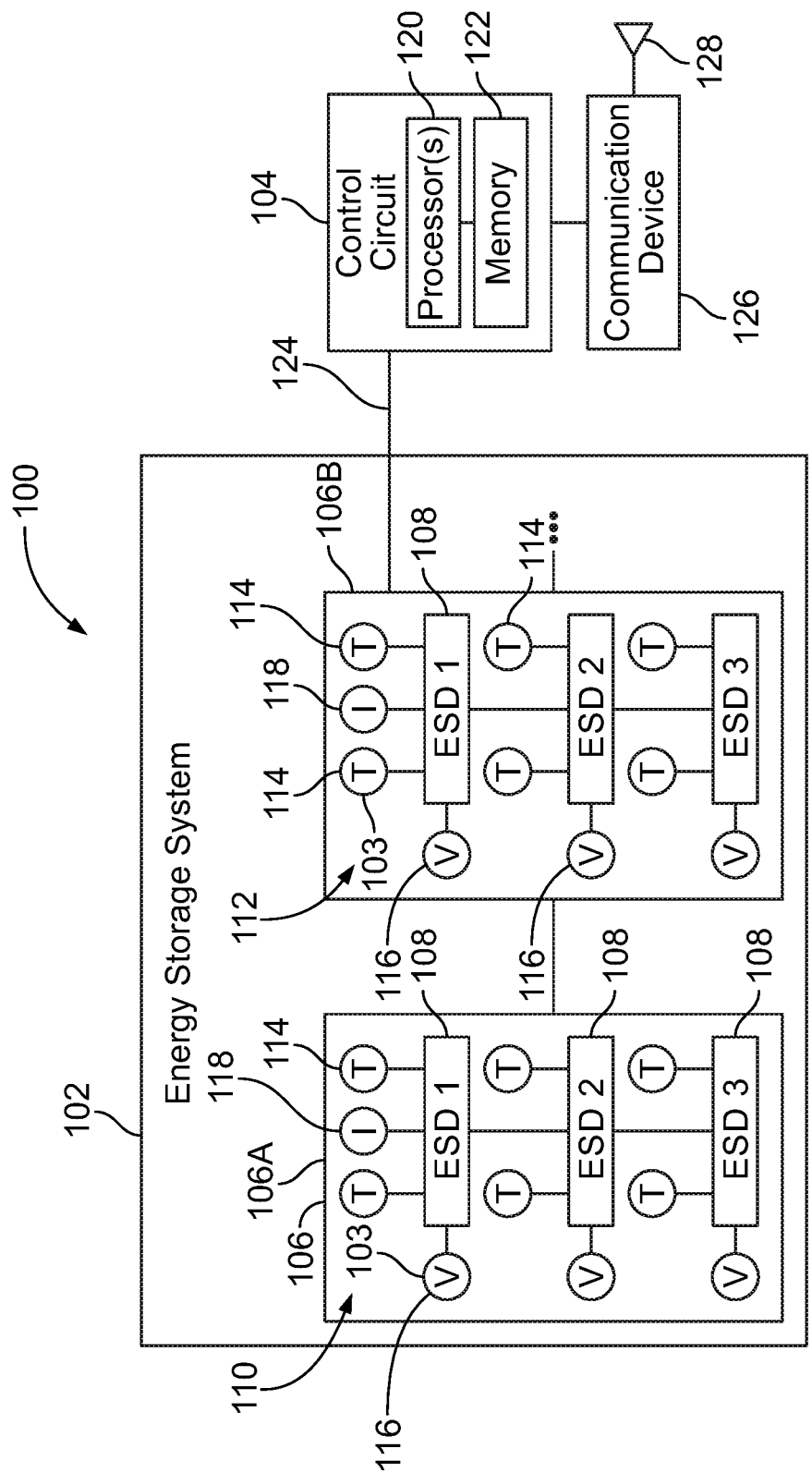
FIG. 1 is a schematic diagram of a deviation detection system according to an embodiment of the disclosure.

One or more embodiments described herein provide a system and method for deviation detection during the operation of energy storage systems. Some deviation detection systems and methods described herein may be based on modeling/observing an expected (or reference) behavior of energy storage modules and detecting deviation conditions based on deviations between monitored behavior of the energy storage modules and the expected behavior. The expected behavior may be determined in the form of parameter values, parameter values over time (e.g., plot lines), changes in parameter values over time (e.g., slopes), variations in parameter values (e.g., ranges), and/or the like. The parameters used to represent the expected behavior may be measured parameters that may be directly measured by sensors and/or derived or transformed parameters that may be derived as a function of sensor measurements. As used herein, parameter values and parameter variations that represent the expected behavior are referred to as reference values and reference variations.

Some items within a group that experience similar operating conditions may be expected to perform similarly. For example, temperature sensors that monitor the temperature of different battery cells in the same module may be expected to generate similar temperature measurements. In addition, temperature sensors in different modules that may be exposed to similar ambient conditions, charge states, and power loads may be expected to generate similar temperature measurements. Conversely, if two energy storage modules experience in a common vehicle experience a known difference in operating conditions, an expected (or reference) temperature difference between the two energy storage modules may be determined. Therefore, if at least one of the temperature sensors records a temperature measurement that deviates from what may be expected, this discrepancy indicates that there may be a malfunction associated with the battery cell, the sensor, or another component of the energy storage system. Although absolute temperature may be mentioned in these examples, derived functions based on temperature may also be considered in the embodiments herein, including rate of change of temperature. Furthermore, the embodiments disclosed herein also consider other parameters besides temperature, such as voltage, power, current, and the like.

A deviation condition may be detected based on excessive deviation from the expected (or reference) behavior, in contrast to known energy storage monitoring systems that detect alarm conditions based on a measured value of a parameter crossing a preset absolute limit or threshold value. The deviation detection system disclosed herein may provide earlier detection of potential failures than the known systems. For example, if the known system has a preset temperature threshold of 40 degrees Celsius (° C.), then the known system does not detect a potential failure until a sensor generates a temperature measurement that may be at least 40° C. But, the deviation detection system described herein may be able to detect a potential failure before the temperature exceeds 40° C. For example, if a measured temperature value deviates from a reference (e.g., expected) value of the temperature or a reference variation (or variance) in the temperature beyond a designated tolerance margin, the deviation detection system detects a deviation condition even if the measured temperature value may be less than 40° C. The earlier detection may enable the deviation detection system to prevent or at least reduce the extent of damage caused by a failure of one or more battery cells, such as fire or thermal runaway, and/or failures of other components, such as sensors.

In addition to providing early detection of potential failures in the energy storage system, the deviation detection system disclosed herein may provide additional information that may be useful for locating, diagnosing, and mitigating damage and delays. For example, the deviation detection system may identify the one or more particular sensors that generated the deviating sensor measurements that triggered the deviation condition, allowing for a precise location of the potential failure. Furthermore, the deviation detection system may automatically initiate one or more responsive or remedial actions upon detecting the deviation condition to prevent or at least mitigate the spread of damage from fire, thermal runaway, or the like. The responsive actions may include isolating one or more energy storage modules by blocking electric current transfer to and from the energy storage module(s), initiating active cooling, initiating fire suppression, or the like. The deviation detection system may also analyze the deviating sensor measurements with sensor measurements representing the same parameter and/or different parameters based on expected behavior associated with different specific fault states to estimate a cause of the deviation condition. For example, the deviation detection system may estimate that the deviation condition may be caused by a malfunctioning energy storage device (e.g., battery cell), a malfunctioning sensor, a bad weld, a short circuit, a malfunctioning cooling system, a broken tab connecting two energy storage devices, or the like.

Estimation of the cause of the deviation condition enables the deviation detection system to take, or at least suggest, failure-specific remedial actions. For example, if the cause may be estimated to be a malfunctioning sensor, the deviation detection system may flag the sensor for repair or replacement and/or ignore or substitute future measurements from that sensor. On the other hand, if the cause may be estimated to be a malfunctioning battery cell experiencing (or at a risk of experiencing) fire or thermal runaway, the deviation detection system may isolate the battery cell, initiate active cooling, and/or the like to prevent the spread of secondary damage from the battery cell. Therefore, instead of merely providing a generic alert once an absolute limit or threshold may be crossed, the deviation detection system described herein may provide early detection of anomalies, as well as additional information such as locations and estimated types and causes of the anomalies, that can be used to provide enhanced protection and operation of the energy storage system.

In one or more embodiments, upon detecting a deviation condition, the system may automatically take one or more immediate temporary actions assuming a worst-case scenario. For example, the worst-case scenario may be that an energy storage module may be on fire and/or experiencing thermal runaway. Thus, prior to estimating the cause of the deviation condition, the system may take immediate action to mitigate potential damage from fire and/or thermal runaway, such as by implementing fire suppression, electrically isolating the energy storage module, derating performance of the vehicle, and/or the like. Then, if it may be subsequently determined that the cause of the deviation condition may be a malfunctioning sensor or another cause that may be less severe than the worst-case scenario, such that there may be no fire or thermal runaway, the system may cease and/or modify the temporary actions that may be based on the worst-case scenario assumption. For example, by modifying the temporary actions upon eliminating fire and/or thermal runaway as the cause, the system may increase the load on the energy storage device, maintain vehicle operation, and/or the like. On the other hand, if the energy storage module may be determined to be at fault, then the system may maintain the temporary actions. The ability of the deviation detection system to maintain and/or alter the actions based on an estimation of the cause may be advantageous over known systems. For example, a known system that detects a deviation may automatically shut down operation of the energy storage module, a vehicle, or the like, requiring an inspection by an operator before enabling additional operation, which may reduce efficiency and significantly slow the performance of an enumerated task.

According to an embodiment, the deviation detection system operates according to an algorithm. The first part of the algorithm may be determining the expected behavior under the assumption that every cell, group of cells, sensor, and/or group of sensors will not fail at the same time. The expected behavior may be developed through a physics-based model combined with operating conditions. For example, given certain characteristics of an energy storage module, such as the state of charge and internal impedance of the battery cells thereof, the reference voltage of the energy storage module can be determined. For a certain change in the stored current (e.g., per unit ampere hours), there may be some amount of expected change in voltage. In addition to, or as an alternative to, modeling the expected behavior, the expected behavior can be determined through tracking the history and operation of the energy storage module over time. Also, the expected behavior can be determined based on comparing the parameters of an energy storage device (e.g., a battery cell) to other energy storage devices in the same module and/or in other modules. It may be expected that cells connected in series should all see the same directional change in voltage for a given change in per unit ampere hours. In a first non-limiting example, if voltage decreases for one cell yet may be increasing for all other cells in a series connection, then it can be deduced that a problem exists. In another non-limiting example, if the voltage may be increasing for one cell much faster than it may be increasing for all other cells in the same module, then the deviation detection system may identify a broken weld as the cause of the deviation. Other parameters besides voltage, such as temperature, power, or the like, may be utilized in the same or other examples of the deviation detection system.

The algorithm may utilize multiple different parameters in order to estimate the cause of the deviation condition. For example, in the presence of a broken weld, not only should the voltage increase at a faster rate, but the resistance and temperature for that cell should be greater than other cells in the same module or cells in another module carrying similar current. Combining the physics-based model with the expectation through comparisons, the deviation detection system disclosed herein can differentiate between sensor failure and an inaccurate model. Some error between reality and the model may be acceptable. Therefore, the deviation detection system incorporates expected deviation as well in the form of a designated tolerance margin. The expected deviation can be due to sensor inaccuracies and design variations, such as a temperature gradient. Expected deviations can also change throughout the course of an operational life of a battery cell, as the internal resistance may change over time. By determining the expected behavior of the parameters and the expected deviation, the deviation detection system can detect when a problem occurs, determine the root cause of the problem, and take the appropriate action.

FIG. 1 may be a schematic diagram of a deviation detection system 100 according to an embodiment of the disclosure. The deviation detection system includes a plurality of sensors 103 and a control circuit 104 operably connected to the sensors 103. The sensors monitor various parameters of an energy storage system 102. The parameters measured by the sensors may include temperature, voltage, current, state of charge, charge capacity, resistance, pressure, coolant flow rate, and/or the like. The coolant may be a fluid such as air or a liquid.

The different parameters listed above may be measured by different sensors that are each specifically constructed for monitoring one or more particular parameters for use by the detection system. For example, temperature may be monitored by one or more temperature sensors, such as thermistors, thermocouples, resistance temperature detectors (RTDs), and the like. The temperature parameter may represent a temperature of one or more of the energy storage devices or the ambient temperature nearby one or more of the energy storage devices. The voltage may be monitored by one or more voltage sensors, such as a non-contact voltage detector. The voltage parameter may represent the voltage supply of an energy storage module. The current may be monitored by one or more current sensors, such as a Hall effect sensor, a fluxgate transformer sensor, and/or the like. The current parameter may represent the electric energy flowing into and/or out of an energy storage module. The state of charge may represent an amount of electric energy actually present within an electric energy module (or device thereof). The charge capacity may represent the amount of electric energy that can be stored within an electric energy module (or a device thereof). The state of charge and/or charge capacity may be measured by an integrated battery tester or based on sensor outputs from a voltage sensor and a current sensor. For example, the state of charge and/or charge capacity may be able to be calculated based on measured current flow and voltage output. The resistance may represent the opposition to the flow of electric current through an electric energy module (or a device thereof). The resistance may be measured based on sensor outputs from the voltage sensor and the current sensor by utilizing Ohm's law. The current and voltage sensors may be integrated into a multimeter to measure the resistance. The pressure may refer to the ambient pressure surrounding the energy storage module(s), and may be measured by pressure sensors such as pressure transducers, piezoelectric elements, and the like. The coolant flow rate may refer to the flow rate of cooling fluid, such as air, a refrigerant, a liquid, a gas (other than air), or the like, which is directed to flow across one or more electric energy modules to absorb and dissipate heat generated by the one or more electric energy modules. The coolant flow rate may be measured by a flow sensor, such as a moving vane meter, a hot wire mass flow sensor, a cold wire mass flow sensor, a membrane sensor, and the like.

The energy storage system stores energy for use in providing work, such as for propelling a vehicle. The energy storage system includes multiple energy storage modules 106. Each energy storage module includes one or more energy storage devices 108 ("ESD" in FIG. 1). The energy storage devices may be battery cells, capacitors, or the like. The energy storage devices in each module may be electrically connected to one another, such as in series or parallel relationship. In the illustrated embodiment, two energy storage modules 106A, 106B may be shown, and each of the energy storage modules 106A, 106B has an assembly of three energy storage devices. The energy storage modules may include more or less than three energy storage devices in other embodiments, such as only one energy storage device, six energy storage devices, ten energy storage devices, or the like. Although two energy storage modules may be shown, the energy storage system may include additional energy storage modules, such as ten energy storage modules, twenty-five energy storage modules, or the like. The different energy storage modules may be electrically connected to one another, such as in a series or parallel relationship, to define a string. Alternatively, the energy storage modules may be electrically isolated from one another. In an alternative embodiment, the energy storage system may have only one energy storage module, and the single energy storage module may include multiple energy storage devices.

The deviation detection system may monitor the operations of the energy storage system by analyzing the sensor measurements generated by the sensors. For example, the sensors may be arranged in a first group 110 and a second group 112. The first group may be associated with the first energy storage module 106A, and the second group 112 may be associated with the second energy storage module 106B. For example, the sensors in the first group monitor various parameters of the first energy storage module. The various parameters of the first energy storage module includes parameters of each of the energy storage devices thereof. In the illustrated embodiment, the sensors in the first group include temperature sensors 114, voltage sensors 116, and a current sensor 118. A different pair of temperature sensors may measure the temperature of each of the energy storage devices, such that there may be six temperature sensors in the first group that measure the temperature of the three energy storage devices. The first group includes three voltage sensors, with each voltage sensor configured to measure the voltage across a different one of the three energy storage devices (or a collection of energy storage devices if in a parallel arrangement). The first group has a single current sensor that measures electric current transfer through the first energy storage module. The second energy storage module may be a replica of the first energy storage module in FIG. 1, and the second group of sensors may be a replica of the first group. The types of sensors, number of sensors, and/or placement of the sensors may be selected based on application specific parameters. For example, the first group and/or second group may include sensors to measure resistance, state of charge, charge capacity, pressure, coolant flow rate, and/or the like. Suitable sensors may be associated with at least one of the energy storage modules of the energy storage system. The adjacency, spacing, sensitivity, and type of the sensors may be leveraged in an application to support aspects of the inventive system.

The control circuit 104 may obtain and analyze sensor measurements generated by the sensors associated with the energy storage system for the purpose of monitoring the operation of the energy storage system and providing efficient, prompt remedies to address malfunctions and/or failures to limit damage. The control circuit includes one or more processors 120 and associated circuitry, such as a computer processor or other logic-based device that performs operations based on one or more sets of programmed instructions (e.g., software). The programmed instructions on which the control circuit operates may be stored on a tangible and non-transitory (e.g., not a transient signal) computer readable storage medium, such as a memory 122. The memory may include one or more computer hard drives, flash drives, RAM, ROM, EEPROM, and the like. Alternatively, instructions that direct operations of the control circuit 104 may be hard-wired into the logic of the control circuit, such as by being hard-wired logic formed in programmable gate arrays (fpga), complex programmable logic devices (cpld), and/or other hardware. In an embodiment, the control circuit may be conductively connected to the sensors via a conductive pathway, such as an electrical cable 124, contactors, an optical cable, circuit traces, or the like, and the control circuit obtains the sensor measurements via the conductive pathway. Optionally, at least some of the sensors may be wirelessly connected to the control circuit, and may wirelessly communicate the sensor measurements to the control circuit 104. The control circuit obtains the sensor measurements generated by the sensors in both the first group associated with the first energy storage module and the second group associated with the second energy storage module.

The control circuit determines a reference value and/or a reference variation of a specific parameter based on the sensor measurements generated by the sensors. The specific parameter may be a measured parameter that may be directly measured by one or more sensors associated with the energy storage modules, such as temperature, voltage, current, or the like. Optionally, the specific parameter may be a derived or transformed parameter that not directly measured by any of the sensors, but rather may be derived as a function of one or more sensor measurements. A first non-limiting example of a derived parameter may be power, which may be derived from current and voltage sensor measurements. Derived parameters may also include statistical metrics, such as mean, median, mode, and the like of a measured parameter (e.g., mean of temperature) or another derived parameter (e.g., mean of power). Other non-limiting examples of the specific parameter may include RMS (root mean square) current, harmonic current, state of charge, capacity, resistance, or the like. Although the reference value and/or reference variation of a single specific parameter may be described herein, it may be recognized that the control circuit may determine respective reference values and/or variations of multiple different specific parameters for determining deviation conditions.

As described in more detail herein, the reference value and/or reference variation may be based on the sensor measurements of the sensors in the first group that monitor the first energy storage module, the sensor measurements of the sensors in the second group that monitor the second energy storage module (and any additional sensor measurements associated with the energy storage system), operating parameters of the energy storage system, inherent characteristics of the energy storage devices (e.g., cell chemistry) of the storage modules, historical information about the energy storage modules (e.g., operating age, state of health, etc.), and/or historical information observed from other energy storage modules (e.g., trends). The reference value and/or variation may vary over time.

There may be several ways that the reference value can be determined for a certain parameter including, but not limited to, comparing parameters within the same module, within the same string, in different strings, different locomotives and by physics or combinations. The control circuit may determine multiple reference values for the same parameter using one or more of these methods. Each of these reference values will have an associated value, variance and/or confidence intervals. For instance, the temperatures of cells within a module may be expected to have less variance than the temperatures of cells within an entire string due to the sensors being enclosed in the same packaging. Each of the reference values for the same parameter and their associated variance/confidence intervals can be combined into a single reference value and reference variance/confidence interval through a transfer function. One example of such a transfer function may be a weighted average where larger weights may be assigned to the reference values that have less variance, or larger weighting based on source. For example, a reference value derived from data within the module may be weighted higher than the reference value derived from data from other modules within the string. Similarly, a reference value derived from data within the string (where the module is) may be weighted higher than the reference value derived from data from modules and/or strings in an adjacent string(s).

To monitor the operations of the first energy storage module, the control circuit receives the sensor measurements from the sensors in the first group and determines monitored values and/or monitored variations of the specific parameter based on these sensor measurements. For example, if the reference value and/or reference variation in the specific parameter represents the control variable, the monitored values and/or variations represent the experimental variable. Like the reference values and/or variations, the monitored values and/or variations of the specific parameter may be direct sensor measurements or derived calculations based on the direct sensor measurements. In a non-limiting example, if the specific parameter may be temperature, the control circuit may determine the monitored values as the temperature measurements generated by all of the corresponding temperature sensors in the first group. In another non-limiting example, if the specific parameter may be power, the control circuit may determine the monitored values as the power calculations derived by multiplying current measurements times voltage measurements. The monitored variations represent differences in the monitored values. For example, a monitored variation may equal the difference in two difference power calculations related to the energy storage module that may be based on different voltage and current measurements.

After determining the monitored values and/or variations, the control circuit may compare the monitored values and/or variations to the reference value and/or variation of the specific parameter. For example, if the specific parameter may be temperature, the control circuit may compare all temperature measurements generated by the temperature sensors in the first group to the reference value and/or reference variation. If at least one of the monitored values and/or variations deviates from the reference value and/or the reference variation by more than a designated tolerance margin or range, then the control circuit detects a deviation condition. The deviation condition represents a status in which a potential failure may be detected. The term potential failure may represent a broad category of scenarios of varying severity, such as a malfunctioning sensor, a broken/damaged tab connecting energy storage devices, a bad weld, a malfunctioning cooling system, a malfunctioning energy storage device (which may experience fire or thermal runaway), or the like. Upon detecting the deviation condition, the control circuit may take one or more responsive actions according to the programmed instructions, such as to notify an operator and/or isolate the energy storage module by blocking electric current transfer to and/or from the energy storage module, at least temporarily until a cause of the deviation condition may be determined and the deviation condition may be remedied.

Optionally, the control circuit may be operably connected to a communication device 126 that represents a component of the deviation detection system with the control circuit and the sensors. The control circuit may generate one or more control signals that may be communicated by the communication device to intended recipients, such as vehicle controllers, human operators, and/or the like. The communication device may include a transceiver (or discrete transmitter and receiver components), an antenna 128, and associated circuitry for wireless bi-directional communication of various types of messages, such as command messages, reply messages, status messages, and/or the like. The communication device may transmit messages to specific designated receivers and/or to broadcast messages. Optionally, the communication device may include circuitry for communicating messages over a wired connection, such as between multiple energy storage systems in the same vehicle or between different vehicles that are electrically couplable.

Figure 2:
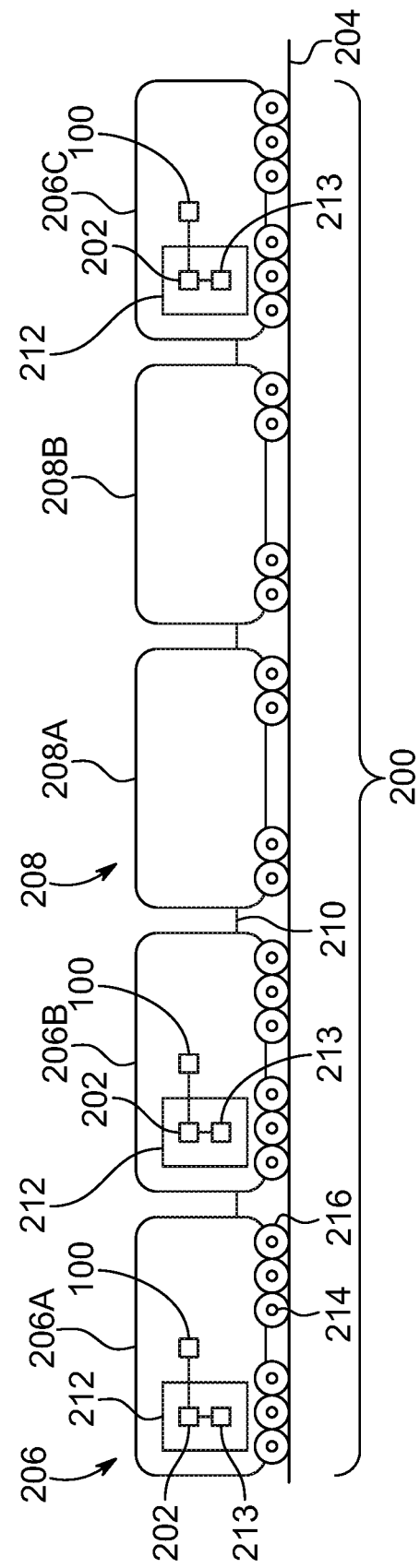
FIG. 2 is a schematic diagram of a vehicle system that incorporates the deviation detection system according to an embodiment.

FIG. 2 is a schematic diagram of a vehicle system 200 that incorporates the deviation detection system 100 according to an embodiment. The vehicle system moves along a route 204. The vehicle system in the illustrated embodiment represents a vehicle consist. Suitable vehicle consists may include a rail vehicle consist (e.g., train) having both propulsion-generating vehicles 206 (e.g., vehicles 206A-C) and non-propulsion-generating vehicles 208 (e.g., vehicles 208A-B) mechanically coupled together by couplers 210 (and may optionally include an electrical connector). In this example, the propulsion-generating vehicles may be locomotives, and the non-propulsion-generating vehicles may be railcars.

Other suitable vehicle consists may include a group of communicatively linked on-road vehicles. In one embodiment, the vehicles are remote-controlled or autonomous. The vehicle system may be formed from several vehicles that may be physically separate from each other but logically coupled with each other to enable communication among the vehicles to coordinate their movements with each. Additionally, a suitable vehicle system may be formed from a single vehicle that is propulsion-generating, instead of from multiple vehicles (whether propulsion generating or not).

Suitable propulsion-generating vehicles include respective propulsion systems 212 that generate tractive effort for propelling the vehicle system along the route. Each propulsion system may have one or more traction motors 213 operably coupled with different axles 214 and/or wheels 216 of the vehicles. The traction motors may be connected with the axles and/or wheels via one or more gears, gear sets, or other mechanical devices to transform rotary motion generated by the traction motors into rotation of the axles and/or wheels. Different traction motors may be operably connected with different axles and/or wheels such that traction motors that may be deactivated (e.g., turned OFF) do not rotate corresponding axles and/or wheels while traction motors that remain activated (e.g., turned ON) rotate corresponding axles and/or wheels. Each propulsion system also includes an energy storage system 202 that provides electrical power to the traction motors. The energy storage system on each propulsion-generating vehicle may be the same or similar to the energy storage system 102 shown in FIG. 1. For example, the traction motors in a propulsion state may be powered by electric current provided to the traction motors by the energy storage system. In a regenerative braking state, the traction motors may supply electric current generated based on the rotation of the wheels and/or axles to the energy storage system for charging energy storage devices (e.g., battery cells or the like) thereof.

The deviation detection system, including the sensors and the control circuit (both shown in FIG. 1), may be disposed onboard each of the propulsion-generating vehicles to monitor operations of the energy storage system thereof. Optionally, a different discrete deviation detection system may be disposed onboard each of the three propulsion-generating vehicles. Alternatively, a single control circuit (e.g., a master control circuit) onboard the vehicle system may obtain sensor measurements from sensors disposed onboard different vehicles to monitor all of the energy storage systems.

While the FIG. 2 illustrates the deviation detection system incorporated onto a rail vehicle consist, the embodiments described herein may be applied to other types of vehicle consists and/or vehicles other than rail vehicles, such as off-highway vehicles (e.g., mining vehicles or other vehicles that may be not designed or permitted for travel on public roadways), marine vessels, automobiles, or the like. Furthermore, the deviation detection system described herein may be utilized to monitor any large format energy storage system, even in stationary industrial, non-vehicular applications.

Figure 3:
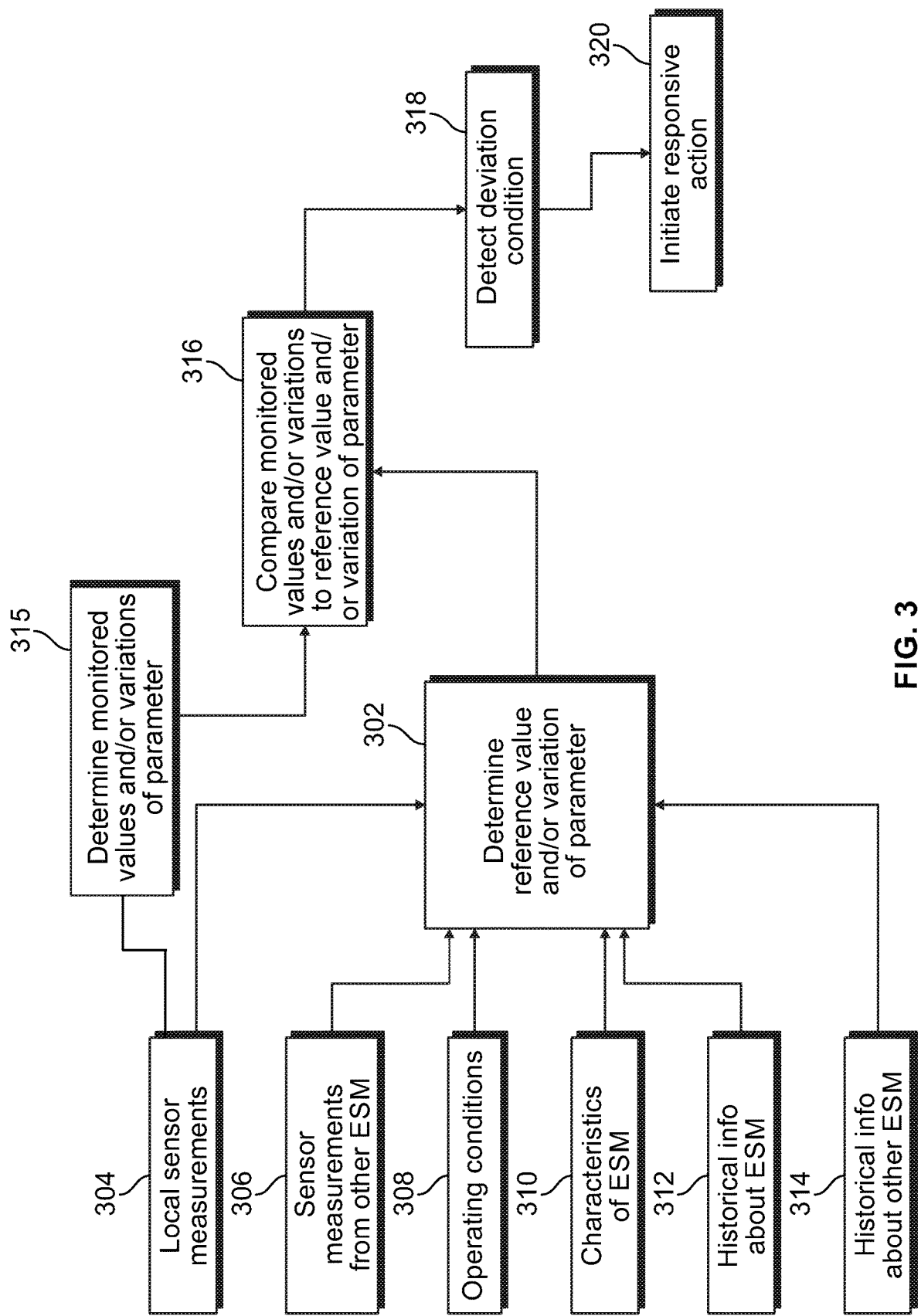
FIG. 3 is a block flow diagram that illustrates operations of a control circuit of the deviation detection system according to an embodiment.

FIG. 3 is a block flow diagram that illustrates operations of the control circuit of the deviation detection system according to an embodiment. At 302, the control circuit determines the reference value and/or reference variation of a specific parameter. The reference value and/or variation represents expected behavior of the energy storage module (or energy storage device thereof) that may be being monitored. The energy storage modules in the same energy storage system (or even different energy storage systems) that experience similar operating conditions may be expected to perform similarly and have similar responses to common stimuli, such as a load or demand for current applied to the storage modules. The energy storage devices within the same energy storage module, and across different energy storage modules, may have the same or similar characteristics. These characteristics may include cell chemistries, capacities, types, age/use/health, lot number, and the like. The reference value and/or reference variation may be a numerical representation of the expected behavior.

The reference value can be a single numerical value, a numerical value over time (e.g., can be plotted on a graph as a plot line), a change in a numerical value over time (e.g., a slope), a rate of change in a numerical value over time, or the like. For example, when the reference value represents temperature over time, the sensor measurements of the temperature sensors would be expected to be at or proximate to a respective value of the expected temperature at each given time. In an embodiment, the reference variation may represent a calculated difference between two or more data points. For example, a reference variation of 10 degrees may indicate that a group of temperature sensors associated with the same energy storage module should not generate temperature measurements that vary from one another by more than 10 degrees. Thus, the lowest temperature measurement should be within the reference variation (e.g., 10 degrees) relative to the highest temperature measurement. The reference variation may vary over time. The reference variation may depend on operating conditions, such as different locations in a system, different voltages in the devices, and/or the like. For example, the reference variation in temperature may be greater if it may be known that the energy storage devices have different locations relative to coolant flow than if all devices may have equal, or about equal, access to the coolant flow. The devices proximate to the coolant flow would be expected to have a lower temperature than the devices farther from the coolant flow. In another embodiment, the reference variation may represent a range of values. For example, the reference variation may be a range defined between two set points, lines, or planes, that represent a lower limit and an upper limit. The position of one or both of the upper limit and the lower limit may change over time, as well as the magnitude of the range between the upper and lower limits.

The reference value and/or variation may be based on various input data received by, or accessible to, the control circuit. The input data used to determine the reference value and/or variation of a specific parameter of the first energy storage module, for example, may include local sensor measurements 304, sensor measurements 306 from other energy storage modules, operating conditions 308, inherent characteristics 310 of the energy storage module, historical information 312 about the first energy storage module, and/or historical information 314 about other energy storage modules.

The local sensor measurements 304 represent raw data generated by the sensors associated with the first energy storage module. Optionally, the control circuit may filter out or substitute some of the sensor measurements that have low quality, such as a low signal-to-noise ratio or a clearly false reading (e.g., temperature measurements from a sensor that do not change over an extended period of time while it may be known from other sensors that the temperature may be changing). If the specific parameter may be temperature, the control circuit may utilize the sensor measurements from all six of the temperature sensors associated with the first energy storage module shown in FIG. 1.

The sensor measurements 306 from other energy storage modules refers to sensor measurements from the second group of sensors associated with the second energy storage module, and may also refer to sensor measurements from other energy storage modules in the same or different energy storage system. For example, to determine the reference value and/or variation of temperature, the control circuit may obtain and compile temperature measurements from all (or a majority) of the temperature sensors in the entire energy storage system.

The operating conditions 308 refer to present ambient conditions and operations of the first energy storage module. For example, operating conditions may include ambient temperature, ambient air flow, pressure, humidity, and the like, in the environment surrounding the first energy storage module. The operating conditions may also include active cooling and/or heating rates. Battery state may be another operating condition, and may refer to a state of charge of each energy storage device of the module, a present charge transfer operation of the module such as supplying electric current or receiving electric current, and/or a present load or current demand on the module. The load on the energy storage module may represent a rate (e.g., ampere hour rate) at which the energy storage module supplies current to a traction motor or to an auxiliary motor. Another operating condition may be vehicle state (e.g., locomotive state for the rail vehicle application), which may refer to whether the vehicle on which the deviation detection system may be disposed may be braking, coasting, accelerating, stationary, shut down, and/or the like.

The characteristics 310 of the energy storage module refer to inherent physics-based characteristics, such as the chemistry of the energy storage devices (e.g., cell chemistry), the type and/or model of the energy storage devices, modeled thermal characteristics of the energy storage devices, and the like. The modeled thermal characteristics may refer to heat generated during operation.

The historical information 312 about the energy storage device may refer to operating ages of the energy storage devices 108 that define the energy storage device and/or states of health of the energy storage devices. For example, the resistance of an energy storage device may be expected to gradually increase over the operational lifetime. The state of health may refer to a condition of the energy storage devices, which may factor in the operational life, charge capacity of the energy storage devices, present state of charge of the energy storage devices, and/or the like. For example, a fully charged energy storage device may be more likely to experience thermal runaway than a partially depleted energy storage device because of the greater amount of stored energy.

The historical information 314 about other energy storage modules may refer to observations and trends based on the performance of the energy storage modules, whether in the same energy storage system or a different energy storage system from the first energy storage module. The other energy storage modules may be similar to the first energy storage module, such as including the same number and/or type of energy storage devices as the energy storage devices in the first module. As an example, the information may include thermal heating rates of the other energy storage modules observed in response to specific stimuli, such as ambient conditions and loads applied on the energy storage modules.

The control circuit may utilize some or all of the input data 304, 306, 308, 310, 312, 314 for determining the reference value and/or variation in the specific parameter. For example, the control circuit may plug the operating conditions, the inherent characteristics of the energy storage module, and the historical information about the energy storage module into a physics-based computational model. The physics-based computational model may be a computer program that generates the reference value and/or reference variation in the specific parameter based on an algorithm that includes multiple calculations utilizing the input data as variables. The physics-based model may also utilize additional information, such as the local sensor measurements, the sensor measurements from other energy storage modules, and/or historical information about other energy storage modules.

As described above, the reference value and/or variation of the specific parameter may be derived from one or more functions and other known relationships based on one or more measurements, such that the reference value and/or variation may be not merely a parameter directly measured by the sensors. Non-limiting examples of derived specific parameters include power, RMS current, harmonic spectrum, bias, resistance, statistical metrics (e.g., mean, median, mode, standard deviation, etc.), and the like. In a non-limiting example, the specific parameter may represent a statistical metric, and the control circuit may compile all sensor measurements representing a given parameter generated by the sensors incorporated onto the energy storage system. Thus, for the temperature parameter, the control circuit may compile the sensor measurements generated by the temperature sensors associated with all of the energy storage modules in the system. Optionally, the control circuit may narrow the scope of compiled sensor measurements to the sensor measurements generated by the particular sensors associated with the same energy storage module or the same energy storage device. The control circuit may determine the reference value and/or variation by performing a statistical calculation on the compiled sensor measurements. For example, the control circuit may compute a reference value of temperature as the average (e.g., mean), median, or other designated value of the complied temperature measurements. Furthermore, the control circuit may arrange the sensor measurements in a distribution from low to high, and may determine the reference variation (or range) of a specific parameter by selecting the measurement values at designated percentiles of the distribution as the upper and lower limits that define the bounds of the reference variation. For example, if the designated percentiles may be 40% and 60%, the control circuit may designate the sensor measurement in the distribution that represents the $40^{th}$ percentile as the lower limit and may designate the sensor measurement in the distribution that represents the $60^{th}$ percentile as the upper limit. The control circuit may determine the reference value and/or variation of the specific parameters by other processes in other embodiments.

The control circuit may determine the reference value and/or variation for each of multiple different specific parameters of the energy storage module. For example, the control circuit may determine a reference value and/or variation for temperature, a different reference value and/or variation for power, a different reference value and/or variation for RMS current, and/or the like.

At 315, the monitored values and/or variations of the specific parameter may be determined. The monitored values and/or variations may be based on the local sensor measurements (at 304) of the sensors associated with the specific energy storage module being analyzed. As described above, the specific parameter may represent a measured parameter, such as temperature, current, voltage, and/or the like, or a derived parameter, such as power, mean temperature, resistance, RMS current, and/or the like. External sources, such as operating conditions, historical information, and sensor measurements from other energy storage modules, may not be used to determine the monitored values and/or variations.

At 316, the control circuit compares the monitored values and/or variations of the specific parameter to the reference value and/or variation of the specific parameter to determine an extent and/or rate of deviation. The comparison may be performed for the purpose of detecting outlier sensor measurements that could indicate a component failure, such as a battery cell on fire or experiencing thermal runaway. The monitored behavior of the energy storage module, based on actual measurements generated by the sensors, may be compared to the expected behavior.

The comparison may incorporate a designated tolerance margin that may be designed to accommodate variances due to sensor accuracy, variances due to different ages of the sensors, gradients due to discrepancies in the packaging conditions and/or locations of the energy storage devices, variances in the quality of battery cell-to-cell connections, and the like. The designated tolerance margin may be a fixed preset range, such as +/−2%, 5%, or 10% of the reference value or a preset number of degrees of a standard deviation from the reference value (e.g., within a standard deviation of 2 degrees). For the temperature parameter, the designated tolerance margin could be set at a percentage or a number in units of degrees, such as +/−2 degrees, 4 degrees, 6 degrees, or 10 degrees from the reference temperature value. Optionally, the designated tolerance margin may be dynamic, and a function of other conditions, such as current, age, and the like. For example, the tolerance margin may change and adjust based on an amount of current through the energy storage module. In the presence of low current rates, the designated tolerance margin may be narrower than in the presence of greater current rates due to variables such as resistances that may be affected by current. In another example, the designated tolerance margin may increase over time as the energy storage module ages, as it may be expected that the energy storage devices would behave closer to the expected during the earlier stages of life than the later stages of life.

The designated tolerance margin optionally may also apply to the reference variation. For example, if the reference variation between temperature measurements may be 10 degrees, the designated tolerance margin may expand the acceptable range of variation to 11 or 12 degrees. Thus, if a measured variance between two temperature measurements may be 10.5 degrees, the control circuit may determine that the variance does not violate the reference variation. Even though the comparisons described may be in terms of individual sensor value or individual transformed value, it may be understood a two or three-dimensional vector comparison (like a line or a plane) may be also contemplated.

At 318, the control circuit detect a deviation condition in response to detecting one or more outlier or deviating monitored values and/or variations. The deviating monitored values and/or variations represent monitored values and/or variations (based on the local sensor measurements 304 generated by one or more sensors associated with the first energy storage module) that deviate from the reference value and/or variation by more than the designated tolerance margin. It may be recognized that these deviating monitored values and/or variations do not include the sensor data that was previously filtered out and/or substituted.

After the deviation condition may be detected, the control circuit initiates one or more responsive actions 320. The responsive actions 320 may include at least temporarily changing operating conditions of the energy storage module, such as blocking electric current transfer to and from the energy storage module to isolate the energy storage module from other modules (e.g., the second module). For example, if the energy storage module may be on fire or has one or more energy storage devices experiencing thermal runaway, isolating the energy storage module may help prevent the spread of damage, such as thermal runway, to the other energy storage modules. The responsive actions may also include adjusting a non-zero rate of electric current transfer of the module, inducing a designated load applied on the module, adjusting an ambient temperature surrounding the module, adjusting an air flow rate around the module, initiating active cooling, initiating fire suppression, flagging the module for repair and/or replacement, derating or otherwise changing operations of the vehicle on which the energy storage system may be installed, notifying a human operator, and/or the like. The control circuit may automatically generate a control signal to initiate one or more of these responsive actions upon detecting the deviation condition.

The control circuit may automatically initiate one or more temporary actions based on a worst-case scenario upon detecting the deviation condition. In an embodiment, the worst-case scenario represents a thermal runaway and/or fire to an energy storage device, which has the potential to spread to other devices in the same or different modules causing significant permanent damage and risk of harm. Therefore, the control circuit may initiate one or more temporary actions associated with thermal runaway and/or fire upon detecting the deviation condition, even if the actual cause may be not as severe. The temporary actions may include increasing active cooling, initiating fire suppression, electrically isolating the energy storage module from other modules, reducing a load on the energy storage system, derating vehicle tractive efforts, notifying an operator, and/or the like.

In an embodiment, the control circuit may also determine which of the sensors generated the sensors on which the deviating monitored values and/or variations may be based, and may flag these sensors. Furthermore, the control circuit may estimate a cause of the deviation condition based at least in part on sensor measurements generated by these particular sensors. As used herein, the cause of the deviation condition may include identification of components and/or conditions of the components. For example, the control circuit may differentiate the cause as one or more of a bad weld, a malfunctioning energy storage device, a malfunctioning sensor, a broken tab connecting two energy storage devices, and/or the like. After estimating the cause, the control circuit may tailor the responsive actions based on the particular estimated cause. For example, if the estimated cause may be a malfunctioning sensor, then the control circuit may flag that sensor for repair or replacement, notify the operator, substitute the sensor, or the like. In addition, because a malfunctioning sensor may be not the worst-case scenario, the control circuit may cease the performance of the temporary remedial actions based on the worst-case scenario. For example, the control circuit may increase the load on the energy storage system, allow for increased performance of the vehicle, slow or stop active cooling, stop fire suppression, and/or the like. In another example, if the estimated cause may be a malfunctioning energy storage device, to prevent or prohibit the spread of secondary damage from fire or thermal runaway, the control circuit may extend performance of the temporary remedial actions based on the worst-case scenario, such as maintaining electrical isolation of the energy storage devices and/or modules at issue, maintaining active cooling, maintaining fire suppression, and/or the like.

Figure 4:
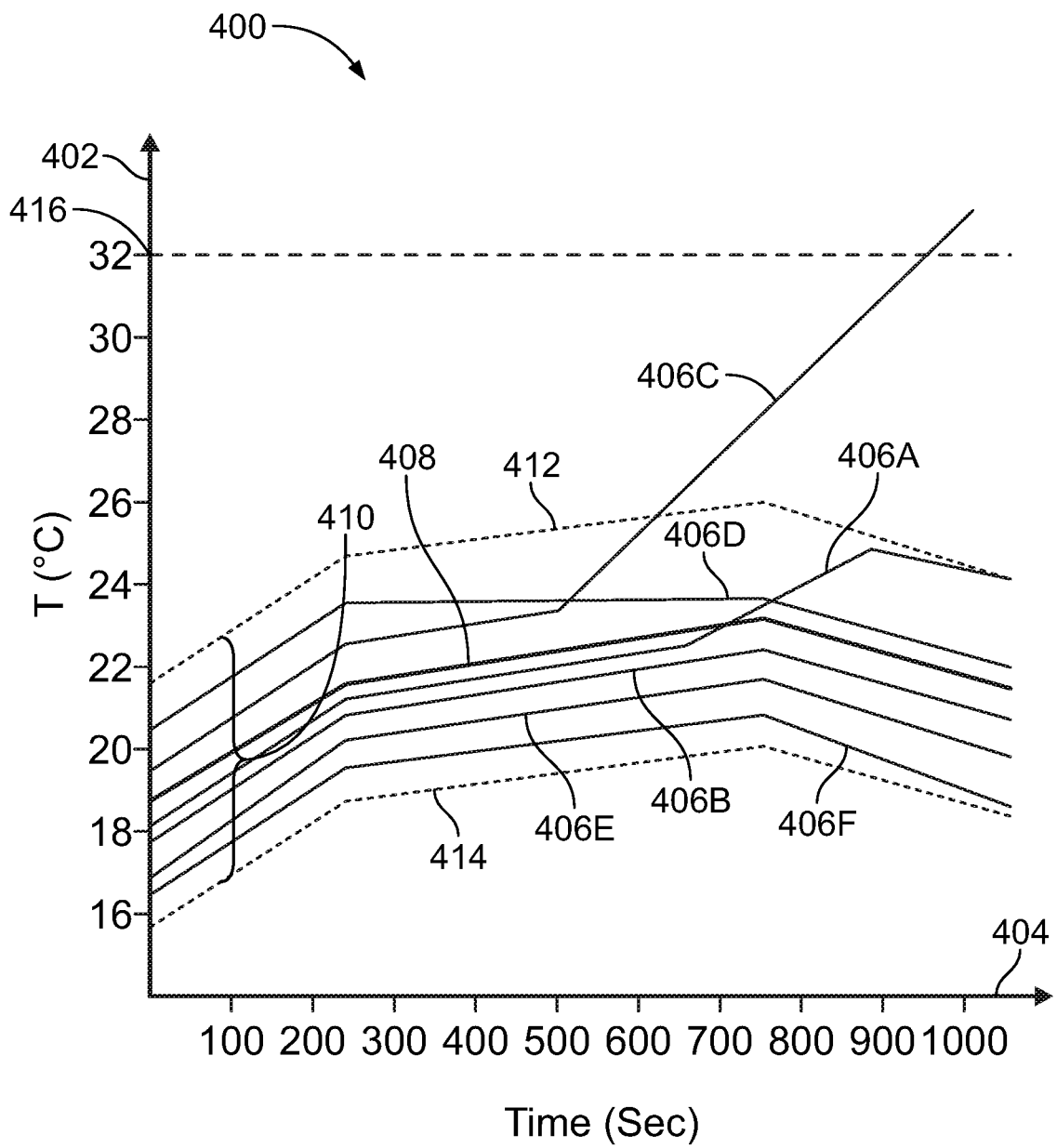
FIG. 4 is a graph plotting sensor measurements generated by temperature sensors associated with an energy storage module according to an embodiment.

FIG. 4 may be a graph 400 plotting sensor measurements generated by temperature sensors associated with an energy storage module (e.g., the temperature sensors 114 shown in FIG. 1) according to an embodiment for easy understanding. The graph includes a vertical axis 402 representing temperature in units of degrees Celsius and a horizontal axis 404 representing time in units of seconds. The graph includes six plot lines 406A-F that represent example sensor measurements generated by each of the six temperature sensors associated with the energy storage module. The energy storage module may be either of the first or second energy storage modules 106A, 106B shown in FIG. 1. A first plot line 406A represents temperature measurements generated by one of the temperature sensors associated with the first energy storage device of the module, and a second plot line 406B represents temperature measurements generated by the other temperature sensor associated with the first energy storage device. A third plot line 406C represents temperature measurements generated by one of the temperature sensors associated with the second energy storage device, and a fourth plot line 406D represents temperature measurements generated by the other temperature sensor associated with the second energy storage device. The fifth and sixth plot lines 406E, 406F represent measurements generated by the two temperature sensors associated with the third energy storage device.

The graph 400 includes a plot line 408 representing the reference (or expected) temperature (e.g., value) over time. The reference temperature line may be bordered above and below by a designated tolerance margin 410. The designated tolerance margin 410 extends above the reference temperature line to an upper line 412, and below the reference temperature line to a lower line 414. In the illustrated embodiment, the designated tolerance margin may be +/−3 degrees from the reference temperature line. For example, when the reference temperature line may be at 22° C. at around 400 seconds, the upper line may be at 25° C. and the lower line may be at 19° C. Although the designated tolerance margin may be static in the illustrated graph, as described above the tolerance margin may be dynamic and may vary over time based on operating conditions, age, etc. Furthermore, although the tolerance margin may be represented by two-dimensional plot lines in the graph, the tolerance margin may be represented in three dimensions along planes, such as if the margin may be a function of multiple parameters.

As shown in the graph, at 100 seconds, all six temperature measurements 406A-F may be within the designated tolerance margin of the reference temperature value. At 500 seconds, something causes the third plot line 406C to indicate a fairly consistent temperature increase, which differs from the other plot lines and the reference temperature line. The third plot line 406C crosses an absolute threshold 416 at the designated temperature of 32° C. at around 900 seconds. A conventional battery monitoring system may detect a deviation at time 900 seconds in response to the third plot line crossing the threshold. The deviation detection system disclosed herein may provide earlier detection of anomalies. For example, the control circuit may detect a deviation condition in response to the third plot line deviating from the reference temperature line by more than the designated tolerance margin, which occurs at or around 600 seconds when the third plot line crosses the upper line. Therefore, the control circuit may detect a deviation condition, and initiate responsive actions, minutes before the deviating temperature measurements exceed the designated threshold, which may prevent or reduce the spread of damage relative to waiting until the threshold may be crossed prior to taking action. In addition, the deviation could be detected by the deviation detection system described herein even before the third plot line crossing the upper line by determining that the rate of change of the temperature represented by differs from the rate of change of the reference value by more than a designated threshold margin. For example, between times 500 and 600 seconds the slope of the plot line may deviate from the slope of the reference temperature line by more than the designated threshold margin, and may be detected by the control circuit as a deviation condition.

The graph 400 also indicates that on or around 650 seconds, the slope of the first plot line 406A changes and deviates from the slope of the reference temperature line. For example, the first plot line indicates a faster temperature increase than the reference temperature line. Although the first plot line does not deviate from the reference temperature line by more than the designated tolerance margin, the control circuit may detect a deviation condition based on the deviation in the slopes between the first plot line and the reference temperature line. Additionally, or alternatively, the control circuit may detect a deviation condition based on the variation between the first plot line and one or more of the other plot lines -F that exceeds a reference variation. For example, the control circuit may determine a reference variation of 3° C. between the sensor measurements of the temperature sensors associated with the same energy storage device (incorporating any designated tolerance margin). The first and second plot lines 406A, 406B represent the sensor measurements of the two temperature sensors associated with the same energy storage device. The graph indicates that the first plot line varies from the second plot line by more than 3° C. at some time between 800 and 900 seconds. Thus, the control circuit may detect the deviation condition in response to the variation between the first and second plot lines exceeding the reference variation (even though the first plot line remains within the designated tolerance margin of the reference temperature line).

The graph indicates that the deviation condition may be detected based on various characteristics of the sensor measurements over time, such as value, change in value (e.g., slope), rate of change in value, variation in sensor measurements, and/or the like. The deviation condition may be detected independent of any of the sensor measurements exceeding a preset threshold, such as the threshold shown in the graph. For example, even if the third plot line in an alternative embodiment were to level out after exceeding the upper line such that the line never exceeds the threshold, the deviation detection system may be able to detect the deviation condition based on the absolute value of the temperature, the slope of the plot line, a variation between the plot line and other monitored temperature plot lines, and/or the like. The deviation detection system may also be configured to detect noisy sensors and/or broken sensors based on the measurements. For example, the plot line generated based on the measurements from a noisy sensor may fluctuate more than plot lines based on measurements from more precise sensors. In addition, broken sensors may provide uniform, unchanging measurements, which would be depicted as a horizontal line in the graph. In response to detecting noisy and/or broken sensors, the control unit may ignore and/or substitute for these sensors.

Although the graph plots temperature measurements by the temperature sensors, it may be understood that the deviation conditions can be detected based on other types of parameters, such as current, voltage, state of charge, charge capacity, pressure, coolant flow rate, and any derived or transformed measurements (e.g., power, RMS current, resistance, etc.), in addition to, or instead of, temperature.

Figure 5:
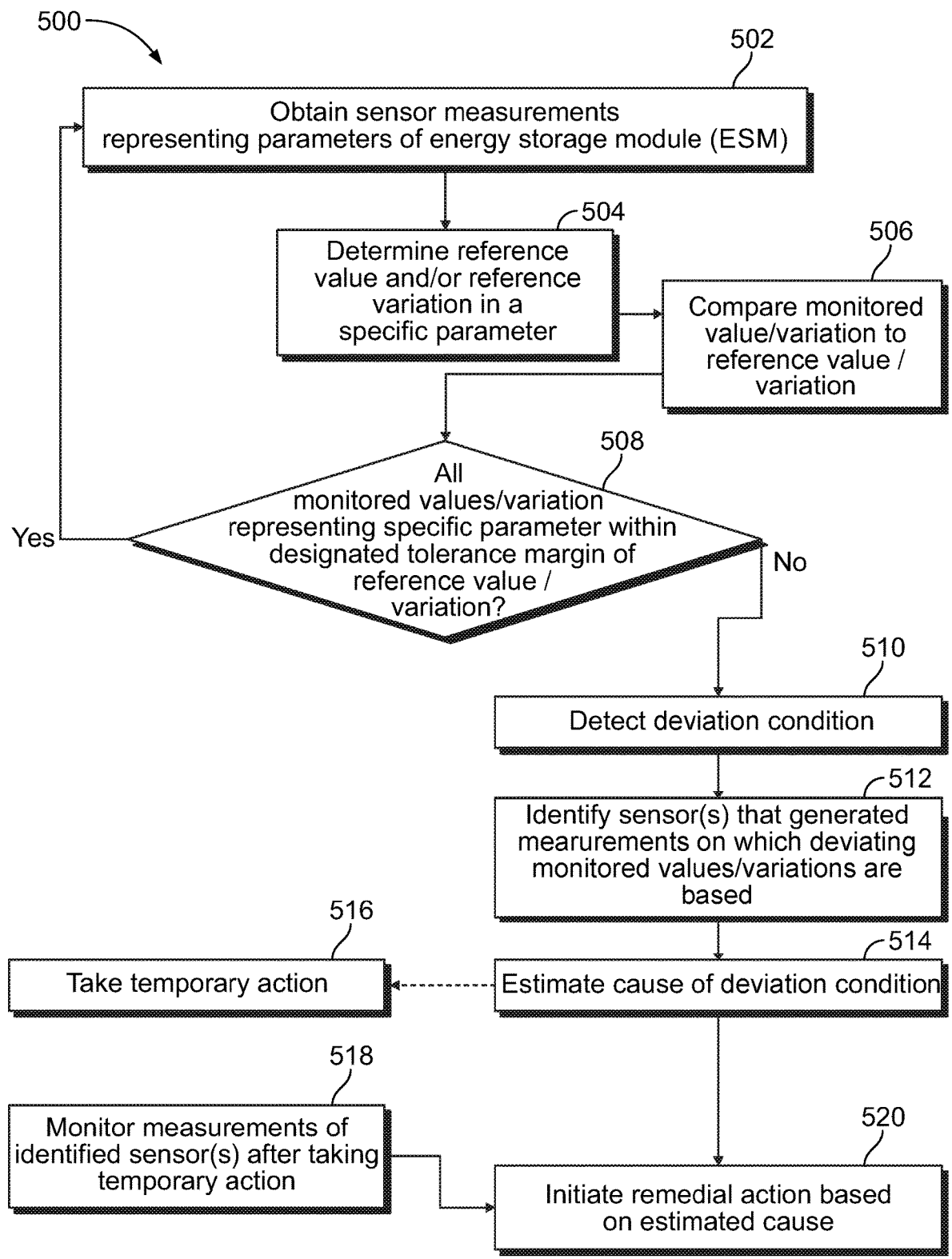
FIG. 5 is a flow chart of a method for detecting and responding to deviation conditions in an energy storage system according to an embodiment.

FIG. 5 may be a flow chart of a method 500 for detecting and responding to deviation conditions in an energy storage system according to an embodiment. The method may be performed in whole or in part by the control circuit 104 shown in FIG. 1, including the one or more processors thereof. Optionally, the method may include additional steps, fewer steps, and/or different steps than the illustrated flow chart.

With additional reference to FIGS. 1 through 4, the method begins at 502, at which sensor measurements representing parameters of an energy storage module may be obtained. The sensor measurements may be generated by a first group of sensors associated with the energy storage module. The energy storage module includes one or more energy storage devices, such as, but not limited to, battery cells. The sensor measurements may be obtained directly from the sensors or by accessing the sensor data from an electronic storage device, such as a memory, a server, or the like.

At 504, a reference value and/or reference variation in a specific parameter of the parameters may be determined. For example, the specific parameter may be temperature, current, voltage, resistance, state of charge, capacity, or the like. The reference value and/or variation may be determined based on the sensor measurements generated by the first group of sensors associated with the energy storage module, sensor measurements generated by a second group of sensors associated with at least a different, second energy storage module 106, inherent characteristics of the energy storage module (and devices thereof), operating conditions of the energy storage module, and/or historical information about the energy storage module or about other energy storage modules.

At 506, monitored values and/or variations representing the specific parameter, which may be based on the obtained sensor measurements from the sensors in the first group associated with the energy storage module, may be compared to the reference value and/or the reference variation of the specific parameter. The monitored values and/or variations based on the sensor measurements of each of the relevant sensors in the first group may be individually compared to the reference value and/or variation. For example, if the specific parameter may be voltage, the voltage measurements of each of the voltage sensors in the first group may be compared to the reference value and/or variation. In another example in which the specific parameter may be power, the voltage and current measurements of the voltage sensors and the current sensor may be used to derive power values and/or variations that may be each compared to the reference power value and/or variation.

At 508, it may be determined whether all of the monitored values and/or variations that represent the specific parameter may be within a designated tolerance margin of the reference value and/or variation of the specific parameter. If none of the monitored values and/or variations deviate from the reference value and/or variation by more than the designated tolerance margin, then the answer may be "yes" and the method returns to 502. If, on the other hand, at least one of the monitored values and/or variations deviates from the reference value and/or variation by more than the tolerance margin, then the answer may be "no" and the method continues to 510.

At 510, a deviation condition may be detected in response to determining that one or more of the monitored values and/or variations may be deviating monitored values and/or variations that deviate from the reference value and/or variation by more than the tolerance margin. The deviation condition indicates that there may be a potential fault or malfunction in one or more components, such as an energy storage device, a sensor, a weld, a tab connecting energy storage devices, or the like. At 512, one or more sensors of the first group may be identified that generated at least some of the sensor measurements on which the deviating monitored values and/or variations may be based. For example, the sensor measurements may have data tags that indicate the source of the measurement (e.g., which sensor generated the measurement). The first sensor may be identified based on the data tag associated with a deviating monitored value and/or variation. Multiple sensors may be identified if the deviating monitored values and/or variations may be based on measurements generated by different sensors.

At 514, a cause of the deviation condition may be estimated. The cause of the deviation condition may be estimated at least in part on the sensor measurements generated by the first sensor and other identified sensors. For example, the cause of the deviation condition may be estimated by analyzing the sensor measurements generated by the first sensor with (i) sensor measurements representing the same parameter generated by other sensors in the first group, (ii) sensor measurements representing another parameter generated by other sensors in the first group, and/or (iii) sensor measurements (representing the same parameter and/or a different parameter) generated by a different group of sensors associated with a different energy storage module. For example, if temperature may be the specific parameter, the outlier temperature measurements generated by one or more temperature sensors in the first group may be analyzed with non-outlier temperature measurements generated by other temperature sensors in the first group, with voltage measurements generated by the voltage sensors in the first group, with current measurements generated by the current sensor of the first group, and/or with temperature, voltage, and current measurements generated by the different sensors of the second group. The cause of the deviation condition may be estimated based on observed trends and relationships in the sensor measurements that may be analyzed, as described in more detail herein.

Optionally, the cause of the deviation condition may be estimated by taking a temporary action at 516 and observing the effects of the temporary action. The temporary action may include changing at least one operating condition of the energy storage module, at least for a designated period of time. The control circuit may initiate the temporary action by generating a control signal to change the operating condition(s). The control signal may be communicated to intended recipients by the communication device. For example, the temporary action may include electrically isolating the energy storage module from other modules in the energy storage system by blocking electric current transfer to and from the energy storage module. The energy storage module may be isolated by opening electrical switches to break conductive paths between the module and adjacent modules. Isolating the module may help to block the spread of damage if it turns out that one or more of the energy storage devices may be on fire or experiencing thermal runaway. Once the energy storage module may be disconnected from other modules, the temperature of the one or more energy storage devices of the module may be expected to move towards the ambient temperature.

Another temporary action may be to initiate, turn off, and/or adjust a cooling or heating medium, such as air conditioning, to change the ambient temperature. If the energy storage devices may be not under a load, the devices should approach the new ambient temperature over time. Yet another optional temporary action may be to adjust an air flow rate around the module, such as by turning on, turning off, or modifying activity of fans or pumps. While the energy storage devices may be under a load, turning off the fans and/or pumps should cause a rise in temperature of the devices, and turning on the fans and/or pumps should cause a decrease in temperature (if the ambient temperature may be lower than the temperature of the devices).

Still other temporary actions may include inducing a designated load on the energy storage module and/or adjusting a non-zero rate of electric current transfer into or out of the energy storage module. The temporary action may be taken for a designated amount of time, which may be preset such as five minutes, thirty minutes, or the like. Optionally, the designated amount of time may extend until the cause of the deviation condition may be estimated. For example, if the cause may be estimated to be a bad sensor, then the temporary action of providing active cooling may be ceased because there may be little if any risk of fire or overheating energy storage devices due to a bad sensor.

At 518, the sensor measurements generated by the identified sensors (which produced the outlier monitored values and/or variations) may be monitored after taking the temporary action. These subsequent post-action measurements of these sensors may be compared to the pre-action sensor measurements generated by the sensors prior to taking the temporary action to determine the affect of the temporary action on the sensor measurements. For example, if the post-action measurements may be consistent with the pre-action measurements even though the change in the operating condition constituting the temporary action would have been expected to alter the measurements, then the cause of the deviation condition may be a malfunctioning sensor. Thus, if temperature measurements of a temperature sensor do not change over time in the presence of active cooling and/or isolation of the module that would be expected to cool the module, then the control circuit may estimate that a temperature sensor may be malfunctioning.

In another example, the post-action measurements of an identified sensor may be compared to the measurements of other sensors that may be assumed to be properly functioning. If the post-action measurements may be consistent with the measurements of the other sensors, then the identified sensor may be estimated to be properly functioning, such that the energy storage device or an associated component may be malfunctioning, broken, or at fault. Additional scenarios for estimating the cause of a deviation condition may be described below.

At 520, after estimating the cause of the deviation condition, a remedial action may be initiated that may be based on the estimated cause. For example, if it may be estimated that a sensor may be bad, then the control circuit may generate a control signal to flag that sensor for replacement, to substitute for that sensor when performing subsequent monitoring, to notify an operator that a sensor may be malfunctioning (e.g., and that the energy storage devices may be properly functioning), to cease temporary actions taken to limit thermal-related damage such as active cooling and/or isolating the energy storage module, and/or the like. In another example, if it may be estimated that an energy storage device of a module may be malfunctioning, then the control circuit may generate a control signal to extend the performance of temporary actions taken to limit thermal-related damage, flag the module for replacement of one or more energy storage devices thereof, notify the operator, derate the performance of a vehicle that incorporates the energy storage system, initiate fire suppression, and/or the like.

Various non-limiting example scenarios may be provided below that indicate how the control circuit may be able to estimate a cause of a deviation condition based on analyzing sensor measurements. The examples below refer to battery cells, but the embodiments described herein may not be limited to battery cells.

In a first temperature example, if only one cell temperature sensor consistently heats up more than other temperature sensors for that cell, then the control circuit may estimate that the cause of the deviation may be a bad weld. In response, the control circuit may ignore the bad weld, notify the operator, continue to operate, derate performance of the energy storage system, and/or shut down the energy storage system, depending on the severity of the bad weld.

In a second temperature example, if the control circuit detects that one cell temperature sensor may be out of range high, and neighboring sensors may be within normal range, the control circuit may isolate the module such that no load may be on the module. If the temperature measurements generated by the one sensor remain out of range high after isolating the module, then that sensor may be malfunctioning. In response, the control circuit may ignore the measurements of that sensor or substitute for that sensor in later monitoring algorithms.

In a third temperature example, if an unexpected rise occurs in two or more temperature sensors and/or if a temperature in a vent duct spikes, then the control circuit may estimate that one or more of the battery cells may be heating up. Depending on the severity, the control circuit may ignore the temperature increase, warn the operator and continue to operate, derate the energy storage system, shutdown the energy storage system, flag the one or more cells for replacement, initiate fire suppression, and/or initiate active cooling.

In a fourth temperature example, if the temperature measurements generated by the temperature sensors may be moving, as a common trend, away from a set ambient temperature (e.g., based on a cooling/heating medium) in an insulated room, then the cooling/heating medium may be malfunctioning. In response, the control circuit may notify an operator that the cooling/heating medium may be not working properly, and may shutdown and prevent further use of the cooling/heating medium.

In a fifth temperature example, if a mean module temperature and cell group temperatures have reached a consistent threshold over time (e.g., from history), then the control circuit may estimate that the energy storage module may be at the end of life. In response, the control circuit may schedule the module for replacement and may prevent further use thereof.

In a first voltage example, if the monitored voltage of one cell increases or decreases under load faster than other cells based on the voltage measurements generated by the voltage sensors, then the control circuit may estimate that a cell tabof the cell may be broken or damaged. In response, the control circuit may ignore the broken cell tab, derate the energy storage module, and/or shut down the energy storage module.

In a second voltage example, a malfunctioning sensor can be detected by comparing a voltage measurement of a module to voltage measurements of individual cells of the module and identifying a discrepancy or deviation. In response, measurements by the malfunctioning sensor may be ignored or substituted in additional monitoring algorithms.

In a third voltage example, by comparing the voltage measurement of a module or a string of modules to a sum of the voltages of the cells thereof and identifying a discrepancy, the control circuit may detect a broken measuring card. In response, one or more of the modules may be flagged for replacement.

In a fourth voltage example, if the cell voltage maximum-to-minimum range for a given module or string of plural modules may be large, then there may be an imbalance. In response, the control circuit may derate performance of the energy storage system and/or perform cell balancing.

In a fifth voltage example, excessive discharge can be detected by tracking the slope of voltage measurements while the module may be under no load. Before turning off the energy storage system, the voltage, temperature, and time may be recorded. Upon the energy storage system coming back online, the voltage, temperature, and time of the same module may be compared to the recorded values to determine if there may be excessive discharge. If there may be excessive discharge, the module may be flagged for replacement.

In a sixth voltage example, if neighboring cells or modules have different voltages during a common time period while the energy storage system may be off-line, such as one increasing and the other decreasing, then the control circuit may detect a short circuit. In response, the control circuit may notify an operator, mechanically disconnect the cells or modules, and/or flag the cells or modules for replacement.

In a seventh voltage example, a failed fuse, connection device, current sensor, or other component may be detected. The control circuit may detect a failed fuse if a current measurement generated by a current sensor may be relatively high, and a monitored voltage of a module or string of modules suddenly drops to zero. A failed connection device can be detected if a voltage measurement does not increase or decrease when expected. A malfunctioning current sensor can be detected if the voltage measurements increase and/or decrease when expected, but the current sensor reads zero. Furthermore, a malfunctioning current sensor can be detected if the magnitude of a current measurement may be relatively high, while voltage measurements may be steady. In response to detecting any of these failed components, the control circuit may isolate the specific module, flag the module (or some internal components thereof) for maintenance, and/or continue operation if available.

In an eighth voltage example, an imminent thermal runaway can be detected in response to a hump-shape in the voltage measurements over time, such as an increase followed shortly by a decrease. In response, the control circuit may disconnect the module, notify an operator, activate fire suppression or active cooling, and/or flag the module for replacement.

In a ninth voltage example, if the voltage measurements indicate that a cell fails to hold a charge and/or voltage depletion may be fast while discharging, the cell may be vented. In response, the control circuit may notify an operator, disconnect or isolate the module, and/or flag the module for replacement.

In a tenth voltage example, if a fast voltage drop may be detected while charging, the control circuit may detect an internal short circuit. In response, the control circuit may notify an operator, disconnect or isolate the module, and/or flag the module for replacement.

In an eleventh voltage example, mis-wiring may be detected in response to a deviation among reference voltage measurements with respect to a wire chassis having a partial connection to a module. In response, the wiring may be flagged for maintenance, operation may continue if available, and/or the module or string of modules may be isolated.

In a twelfth voltage example, a ground fault may be detected in response to a shift in voltage measurements associated with a string of modules. The sum of voltage measurements through the modules may be determined to verify the shift. In response, the control circuit may isolate the string of modules, continue operation, notify an operator, and/or schedule maintenance.

A technical effect of one or more embodiments of the deviation detection system and method described herein may include early detection of malfunctioning and failed components, which enables early remedial actions to prevent and/or reduce damage caused by the malfunctions and failures. For example, early detection of fire and/or thermal runaway in an energy storage device may allow for early actions to prohibit the spread of fire and thermal runaway to other energy storage devices, thereby reducing danger and conserving and extending the life of the functioning energy storage devices. Another technical effect of the deviation detection system and method may include the ability to provide automated, cause-specific responses to detected anomalies. For example, by estimating a cause of the anomalies based on an analysis of sensor measurements, the control circuit may initiate actions that may be specifically tailored to the estimated cause, which increases efficiencies and provides better support to the energy storage system than known monitoring systems that provide the same responsive actions for every detected deviation. For example, if the control circuit estimates that the cause of the deviation may be trivial, such as a broken sensor, then the control circuit may allow the energy storage system to continue operations, thereby providing beneficial work output, rather than automatically shutting the energy system down to address the worst-case scenario of fire and/or thermal runaway.

In an embodiment, a system includes a first group of sensors and a control circuit including one or more processors. The first group of sensors is associated with an energy storage module that includes one or more energy storage devices. The sensors in the first group are configured to generate sensor measurements representing one or more parameters of the energy storage module. The control circuit is configured to receive the sensor measurements generated by the sensors and determine a reference value and/or a reference variation of a specific parameter related to the energy storage module based at least in part on the sensor measurements. The control circuit is configured to compare monitored values and/or monitored variations of the specific parameter, based on the sensor measurements generated by sensors of the first group, to the reference value and/or the reference variation of the specific parameter and detect a deviation that is greater than a designated tolerance margin.

Optionally, the control circuit is configured to determine the reference value and/or reference variation of the specific parameter based on the sensor measurements generated by the first group of sensors associated with the energy storage module and one or more of: (i) sensor measurements generated by a second group of sensors associated with a different, second energy storage module, (ii) inherent characteristics of the energy storage module, (iii) operating conditions of the energy storage module, or (iv) historical information about the energy storage module or about other energy storage modules.

Optionally, responsive to detecting the deviation that is greater than the designated tolerance margin, the control circuit is configured to identify a particular sensor in the first group that generated sensor measurements on which one or more of the deviating monitored values and/or monitored variations are based. The control circuit is configured to estimate a cause of the deviation by comparing the sensor measurements generated by the particular sensor to sensor measurements generated by other sensors in the first group or generated by other sensors in a second group associated with a different, second energy storage module.

Optionally, responsive to detecting the deviation that is greater than the designated tolerance margin, the control circuit is configured to generate a control signal configured to change one or more of the operating conditions of the energy storage module. Optionally, the control signal is configured to change one or more of the operating conditions of the energy storage module by one or more of: (i) blocking electric current transfer of the energy storage module, (ii) adjusting a non-zero rate of electric current transfer of the energy storage module, (iii) adjusting an ambient temperature surrounding the energy storage module, (iv) adjusting a temperature conditioning rate around the energy storage module, (v) inducing a designated load on the energy storage module, (vi) initiating active cooling, (vii) initiating fire suppression, or (viii) flagging the energy storage module for repair.

Optionally, the control circuit is configured to identify a particular sensor in the first group that generated sensor measurements on which one or more of the deviating monitored values and/or monitored variations are based. The control circuit is configured to monitor additional sensor measurements generated by the particular sensor during a determined period of time after changing one or more of the operating conditions of the energy storage module. The control circuit is configured to estimate a cause of the deviation based at least in part on the additional sensor measurements generated by the particular sensor during the determined period of time.

Optionally, the control circuit is further configured to detect the deviation that is greater than the designated tolerance margin independent of any of the sensor measurements exceeding a preset threshold value.

Optionally, the one or more energy storage devices of the energy storage module are batteries. The energy storage module represents one or more of a single battery cell, an assembly of multiple battery cells connected to one another in series, or an assembly of multiple battery cells connected to one another in parallel.

Optionally, the specific parameter is one of temperature, voltage, current, power, state of charge, charge capacity, pressure, coolant flow rate, or resistance.

Optionally, the control circuit is configured to determine the reference value and/or the reference variation of the specific parameter based on a physics-based model that incorporates inherent characteristics of the energy storage module, operating conditions of the energy storage module, and historical information about the energy storage module.

Optionally, the control circuit is configured to determine the reference value and/or the reference variation of the specific parameter at least in part by compiling the sensor measurements that are generated by the sensors in the first group.

Optionally, the control circuit and the first group of sensors are disposed onboard a vehicle that is propelled at least in part by the energy storage module.

In an embodiment, a method includes obtaining sensor measurements generated by a first group of sensors associated with an energy storage module. The energy storage module includes one or more energy storage devices. The sensor measurements represent one or more parameters of the energy storage module. The method includes comparing monitored values and/or monitored variations of a specific parameter related to the energy storage module to a reference value and/or a reference variation of the specific parameter. Both the monitored values and/or monitored variations and the reference value and/or reference variation are based at least in part on the sensor measurements generated by the first group of sensors. The method includes detecting a deviation condition responsive to one or more of the monitored values and/or monitored variations deviating from the reference value and/or reference variation by more than a designated tolerance margin. The method also includes identifying a first sensor of the first group that generated sensor measurements on which one or more of the deviating monitored values and/or monitored variations are based, and estimating a cause of the deviation condition based at least in part on the sensor measurements generated by the first sensor.

Optionally, responsive to detecting the deviation condition, the method also includes generating a control signal to change one or more operating conditions of the energy storage module. Optionally, the cause of the deviation condition is estimated at least in part by comparing the sensor measurements generated by the first sensor prior to changing the one or more operating parameters of the energy storage module to sensor measurements generated by the first sensor after changing the one or more operating parameters.

Optionally, the control signal is configured to change the one or more operating conditions by one or more of: (i) adjusting an ambient temperature surrounding the energy storage module, (ii) adjusting a temperature conditioning rate around the energy storage module, (iii) inducing a designated load on the energy storage module, (iv) substituting the first sensor, (v) blocking electric current transfer operation of the energy storage module, (vi) adjusting a non-zero rate of electric current transfer of the energy storage module, (vii) initiating active cooling, (viii) initiating fire suppression, or (ix) flagging the energy storage module for repair Optionally, the method also includes determining the reference value and/or the reference variation of the specific parameter based on the sensor measurements generated by the first group of sensors associated with the energy storage module and one or more of: (i) sensor measurements generated by a second group of sensors associated with a different, second energy storage module, (ii) inherent characteristics of the energy storage module, (iii) operating conditions of the energy storage module, or (iv) historical information about the energy storage module or about other energy storage modules.

Optionally, the cause of the deviation condition is estimated by comparing the sensor measurements generated by the first sensor to one or more of: (i) sensor measurements generated by other sensors in the first group or (ii) sensor measurements generated by a second group of sensors associated with a different, second energy storage module.

Optionally, the specific parameter is one of temperature, voltage, current, power, state of charge, charge capacity, pressure, coolant flow rate, or resistance.

In an embodiment, a system includes a control circuit with one or more processors. The control circuit is configured to obtain sensor measurements generated by a first group of sensors associated with an energy storage module that includes one or more energy storage devices. The sensor measurements represent one or more parameters of the energy storage module. The control circuit is configured to compare the sensor measurements that represent a specific parameter of the one or more parameters to a reference value of the specific parameter and/or a reference variation of the specific parameter. In response to detecting that one or more of the sensor measurements deviates from the reference value and/or reference variation by more than a designated tolerance margin, the control circuit is configured to identify a first sensor of the first group that generated at least some of the one or more deviating sensor measurements, estimate a cause of the deviation based at least in part on the sensor measurements generated by the first sensor, and generate a control signal to initiate one or more remedial actions based on the estimated cause.

The above description is illustrative and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein define the parameters of the inventive subject matter, they are by no means limiting and are example embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled.

This written description uses examples to disclose several embodiments of the inventive subject matter and also to enable one of ordinary skill in the art to practice the embodiments of inventive subject matter, including making and using any devices or systems and performing any incorporated methods. The patentable scope of the inventive subject matter is defined by the claims, and may include other examples that occur to one of ordinary skill in the art. Such other examples are within the scope of the claims if they have structural elements that do not differ from the literal language of the claims, or if they include equivalent structural elements with insubstantial differences from the literal languages of the claims.

The foregoing description of certain embodiments of the inventive subject matter will be understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112 (f), unless and until such claim limitations expressly use the phrase "means for" followed by a statement of function void of further structure.

What is claimed is:

1. A system comprising:
    a first group of sensors associated with an energy storage module that includes multiple energy storage devices, the sensors in the first group configured to generate sensor measurements representing one or more parameters of the energy storage module; and
    a control circuit including one or more processors, the control circuit configured to receive the sensor measurements generated by the sensors and determine one or more of (i) a reference value of a specific parameter of the one or more parameters over time based at least in part on the sensor measurements generated by at least two of the sensors in the first group and corresponding to at least two of the energy storage devices of the energy storage module, or (ii) a reference variation of the specific parameter of the one or more parameters over time based at least in part on the sensor measurements generated by the at least two sensors in the first group and corresponding to the at least two energy storage devices of the energy storage module,
    the control circuit is configured to compare one or more of a monitored value of the specific parameter, based on the sensor measurements generated by the sensors of the first group, to the reference value, or a monitored variation of the specific parameter, based on the sensor measurements generated by the sensors of the first group, to the reference variation, and detect a deviation condition responsive to one or more of (i) a rate of change of the monitored value differing from a rate of change of the reference value by more than a designated tolerance margin or (ii) the monitored variation between two monitored values of the specific parameter exceeding the reference variation by more than the designated tolerance margin, wherein the two monitored values that define the monitored variation are based on the sensor measurements generated by two different sensors in the first group, and
    responsive to detecting the deviation condition, the control circuit is configured to generate a control signal configured to change an operating condition of the energy storage module; wherein the operating condition of the energy storage module is changed based on the control signal.

2. The system of claim 1, wherein the control circuit is configured to determine the reference value or the reference variation of the specific parameter based on the sensor measurements generated by the first group of sensors associated with the energy storage module and one or more of: (i) sensor measurements generated by a second group of sensors associated with a different, second energy storage module, (ii) inherent characteristics of the energy storage module, (iii) operating conditions of the energy storage module, or (iv) historical information about the energy storage module or about other energy storage modules.

3. The system of claim 1, wherein, responsive to detecting the deviation condition, the control circuit is configured to identify a particular sensor in the first group that generated sensor measurements on which the monitored value that deviates or the monitored variation that deviates is based, and
    the control circuit is configured to estimate a cause of the deviation by comparing the sensor measurements generated by the particular sensor to sensor measurements generated by other sensors in the first group or generated by other sensors in a second group associated with a different, second energy storage module.

4. The system of claim 1, wherein the control signal is configured to change the operating condition of the energy storage module by one or more of blocking electric current transfer of the energy storage module, adjusting a non-zero rate of electric current transfer of the energy storage module, adjusting an ambient temperature surrounding the energy storage module, adjusting a temperature conditioning rate around the energy storage module, inducing a designated load on the energy storage module, initiating active cooling, initiating fire suppression, or flagging the energy storage module for repair.

5. The system of claim 1, wherein the control circuit is configured to identify a particular sensor in the first group that generated sensor measurements on which the monitored value that deviates or the monitored variation that deviates is based, and
    the control circuit is configured to monitor additional sensor measurements generated by the particular sensor during a determined period of time after changing the operating condition of the energy storage module, the control circuit configured to estimate a cause of the deviation based at least in part on the additional sensor measurements generated by the particular sensor during the determined period of time.

6. The system of claim 1, wherein the control circuit is further configured to detect the deviation condition independent of any of the sensor measurements exceeding a preset threshold value.

7. The system of claim 1, wherein the energy storage module comprises multiple battery cells connected to one another in series or in parallel.

8. The system of claim 1, wherein the specific parameter is one of temperature, voltage, current, power, state of charge, charge capacity, pressure, coolant flow rate, or resistance.

9. The system of claim 1, wherein the control circuit is configured to determine the reference value or the reference variation of the specific parameter based on a physics-based model that incorporates inherent characteristics of the energy storage module, operating conditions of the energy storage module, and historical information about the energy storage module.

10. The system of claim 1, wherein the control circuit is configured to determine the reference value or the reference variation of the specific parameter at least in part by compiling the sensor measurements representing the specific parameter that are generated by the at least two sensors in the first group and corresponding to the at least two energy storage devices of the energy storage module.

11. The system of claim 1, wherein the control circuit and the first group of sensors are disposed onboard a vehicle that is propelled at least in part by the energy storage module.

12. The system of claim 1, wherein the control circuit is configured to determine the reference value by compiling the sensor measurements representing the specific parameter that are generated by the at least two sensors in the group and corresponding to the at least two energy storage devices of the energy storage module, and calculating a statistical metric of the sensor measurements that are compiled.

13. The system of claim 1, wherein the control circuit is configured to compare the monitored variation of the specific parameter to the reference variation of the specific parameter and detect the deviation condition responsive to the monitored variation between the two monitored values of the specific parameter exceeding the reference variation by more than the designated tolerance margin.

14. A method comprising:
obtaining sensor measurements generated by a first group of sensors associated with an energy storage module, the energy storage module including multiple energy storage devices, the sensor measurements representing one or more parameters of the energy storage module;
determining one or more of (i) a reference value of a specific parameter of the one or more parameters over time based at least in part on the sensor measurements generated by at least two of the sensors in the first group and corresponding to at least two of the energy storage devices of the energy storage module, or (ii) a reference variation of the specific parameter of the one or more parameters over time based at least in part on the sensor measurements generated by the at least two sensors in the first group and corresponding to the at least two energy storage devices of the energy storage module;
comparing one or more of a monitored value of the specific parameter, based on the sensor measurements generated by the first group of sensors, to the reference value, or a monitored variation of the specific parameter, based on the sensor measurements generated by the first group of sensors, to the reference variation;
detecting a deviation condition responsive to one or more of (i) a rate of change of the monitored value differing from a rate of change of the reference value by more than a designated tolerance margin or (ii) the monitored variation between two monitored values of the specific parameter exceeding the reference variation by more than the designated tolerance margin, wherein the two monitored values that define the monitored variation are based on the sensor measurements generated by two different sensors in the first group, and
responsive to detecting the deviation condition, generating a control signal configured to change an operating condition of the energy storage module; wherein the operating condition of the energy storage module is changed based on the control signal.

15. The method of claim 14, further comprising estimating a cause of the deviation condition by comparing the sensor measurements generated by a first sensor of the sensors prior to changing the operating condition of the energy storage module to sensor measurements generated by the first sensor after changing the operating condition.

16. The method of claim 14, wherein the control signal is configured to change the operating condition by one or more of adjusting an ambient temperature surrounding the energy storage module, adjusting a temperature conditioning rate around the energy storage module, inducing a designated load on the energy storage module, substituting at least one of the sensors, blocking electric current transfer operation of the energy storage module, adjusting a non-zero rate of electric current transfer of the energy storage module, initiating active cooling, initiating fire suppression, or flagging the energy storage module for repair.

17. The method of claim 14, further comprising estimating a cause of the deviation condition by comparing the sensor measurements generated by a first sensor of the sensors in the first group, on which the monitored value that deviates or the monitored variation that deviates is based, to the sensor measurements generated by other sensors in the first group or sensor measurements generated by a second group of sensors associated with a different, second energy storage module.

18. The method of claim 14, wherein the specific parameter is one of temperature, voltage, current, power, state of charge, charge capacity, pressure, coolant flow rate, or resistance.

19. The method of claim 14, wherein the deviation condition is detected responsive to the monitored variation between the two monitored values of the specific parameter exceeding the reference variation by more than the designated tolerance margin.

20. A system comprising:
a control circuit including one or more processors, the control circuit configured to obtain sensor measurements generated by a group of sensors associated with an energy storage module that includes multiple energy storage devices, the sensor measurements representing one or more parameters of the energy storage module, the control circuit configured to compare the sensor measurements that represent a specific parameter of the one or more parameters to one or more of a reference value of the specific parameter or a reference variation of the specific parameter, wherein each of the reference value and the reference variation is based at least in part on the sensor measurements generated by at least two of the sensors in the group and corresponding to at least two of the energy storage devices of the energy storage module, the control circuit configured to detect a deviation condition responsive to one or more of (i) a rate of change of the sensor measurements of the specific parameter differing from a rate of change of the reference value by more than a designated tolerance margin or (ii) a variation between two of the sensor measurements of the specific parameter, generated by two different sensors in the first group, exceeding the reference variation by more than the designated tolerance margin, and in response to detecting the deviation condition, the control circuit is configured to identify a first sensor of the group that generated one or more of the sensor measurements that deviate from the reference value or from the reference variation, estimate a cause of the deviation based at least in part on the sensor measurements generated by the first sensor, and generate a control signal to modify cooling of the energy storage module; wherein the cooling of the energy storage module is changed based on the control signal.

* * * * *